(12) United States Patent
Abe et al.

(10) Patent No.: US 7,294,250 B2
(45) Date of Patent: Nov. 13, 2007

(54) METHOD OF MANUFACTURING MGB$_2$ SUPERCONDUCTING MATERIAL

(75) Inventors: Hideki Abe, Ibaraki (JP); Hideaki Kitazawa, Ibaraki (JP); Kenji Yoshii, Hyogo (JP); Junichiro Mizuki, Hyogo (JP)

(73) Assignee: Japan Atomic Energy Research Institute, Kashiwa-Shi, Chiba (JP)

( * ) Notice: Subject to any disclaimer, the term of this patent is extended or adjusted under 35 U.S.C. 154(b) by 692 days.

(21) Appl. No.: 10/862,365

(22) Filed: Jun. 8, 2004

(65) Prior Publication Data

US 2005/0034992 A1    Feb. 17, 2005

(30) Foreign Application Priority Data

Jun. 9, 2003    (JP) .............................. 2003-164325

(51) Int. Cl.
*H01L 39/24*    (2006.01)
(52) U.S. Cl. .................. 205/51; 205/232; 205/358; 505/472

(58) Field of Classification Search ................. 205/51, 205/232, 358; 505/472
See application file for complete search history.

(56) References Cited

OTHER PUBLICATIONS

Abe et al. artilce entitled, Electroplating of superconducting films of MgB2 from molten salts (2002) no month given.*
Jadhav et al., article entitled, Electrochemical synthesis of superconducting magnesium diboride films: a novel potential technique. Supercond. Sci. Technol. 16 (May 2003) 752-759.*

* cited by examiner

*Primary Examiner*—Arun S. Phasge
(74) *Attorney, Agent, or Firm*—Wenderoth, Lind & Ponack, L.L.P.

(57) ABSTRACT

A very small amount of copper chloride or zinc oxide is added to a mixture of magnesium chloride, potassium chloride, sodium chloride and magnesium borate, a mixed salt is melted under heat, electrodes are inserted into a molten salt and a metallic material employed as a cathode is electroplated with a magnesium diboride (MgB$_2$) film.

2 Claims, 2 Drawing Sheets

METHOD OF MANUFACTURING $MgB_2$ SUPERCONDUCTING MATERIAL

BACKGROUND OF THE INVENTION

1. Field of the Invention

This invention relates to a method of manufacturing a $MgB_2$ superconducting material. More particularly, it relates to a method which can manufacture a $MgB_2$ superconducting material in a thin film form, which can be applied to a fabrication of a wide variety of devices.

2. Description of the Related Art

Magnesium diboride ($MgB_2$) has the highest critical temperature (Tc=39K) among all the intermetallic compounds. Its application is, therefore, expected as a substitute for the A15 type intermetallic compounds (Tc=15K).

The synthesis of a single phase bulk of $MgB_2$ is, however, considered difficult because of a very large difference in vapor pressure between its constituent elements, Mg and B.

SUMMARY OF THE INVENTION

It is an object of this invention to provide a method which can manufacture a $MgB_2$ superconducting material in a thin film form with keeping good superconducting property.

This invention provide a method of manufacturing a $MgB_2$ superconducting material which comprises the steps of adding copper chloride ($CuCl_2$) or zinc oxide (ZnO) to a mixture of magnesium chloride ($MgCl_2$), potassium chloride (KCl), sodium chloride (NaCl) and magnesium borate ($Mg_3(BO_3)_2$) in the amount of copper chloride or zinc oxide much smaller than the amount of the mixture, melting a mixed salt under heat, inserting electrodes into a molten salt and electroplating a metallic material as a cathode with a magnesium diboride ($MgB_2$) film.

DETAILED DESCRIPTION OF THE INVENTION

According to this invention, copper chloride or zinc oxide is added to a mixture of magnesium chloride, potassium chloride, sodium chloride and magnesium borate. The amount of copper chloride or zinc oxide is much smaller than the amount of the mixture. A mixed salt is melted under heat and electrodes are inserted into a molten salt. A metallic material as a cathode is electroplated with a magnesium diboride ($MgB_2$) film. The addition of copper chloride or zinc oxide to the mixture of magnesium chloride, potassium chloride, sodium chloride and magnesium borate as a starting material improves conductivity of a $MgB_2$ plating film. The effect is obtained in the case where the amount of copper chloride or zinc oxide is very small as compared with the amount of the mixture of magnesium chloride, potassium chloride, sodium chloride and magnesium borate.

The metallic material to be employed by the method of this invention is not particularly limited in kind and shape. Stainless steel may, for example, be employed. Stainless steel is widely used as a substrate for a wire in tape form. The metallic material may be in the shape of a tape, wire or coil, for example.

Description of the method according to this invention will now be made in further detail by way of examples.

EXAMPLES

Copper chloride or zinc oxide was added to a mixture of magnesium chloride, potassium chloride, sodium chloride and magnesium borate in a molar ratio of 10:5:5:1. A molar ratio of the copper chloride or zinc oxide is equal to 1/100 of the amount of the mixture. The resulting mixed salt was melted by heating to or above 600° C. in a dry argon gas stream. Then, a carbon rod having a diameter of 1 mm was inserted into a molten salt as an anode, and a stainless steel tape having a thickness of 0.2 mm and a width of 15 mm as a cathode. The two electrodes had a distance of 5 mm therebetween. A DC voltage of 4 V was applied to the electrodes. After 30 minutes, the stainless steel tape as a cathode was removed from the molten salt and placed in dry dimethylformamide for wetting it. After several hours of wetting, the stainless steel tape was removed from the dry dimethylformamide and placed in dry methanol for ultrasonic cleansing, whereby each of the electrolytes adhering to surfaces of the stainless steel tape was melted away completely. A $MgB_2$ film was formed on the front and rear surfaces of the stainless steel tape.

A gold wire having a diameter of 50 μm was bonded to a surface of the $MgB_2$ plating film with a silver paste and electrical resistance was measured by the four-probe method.

Figure 1:
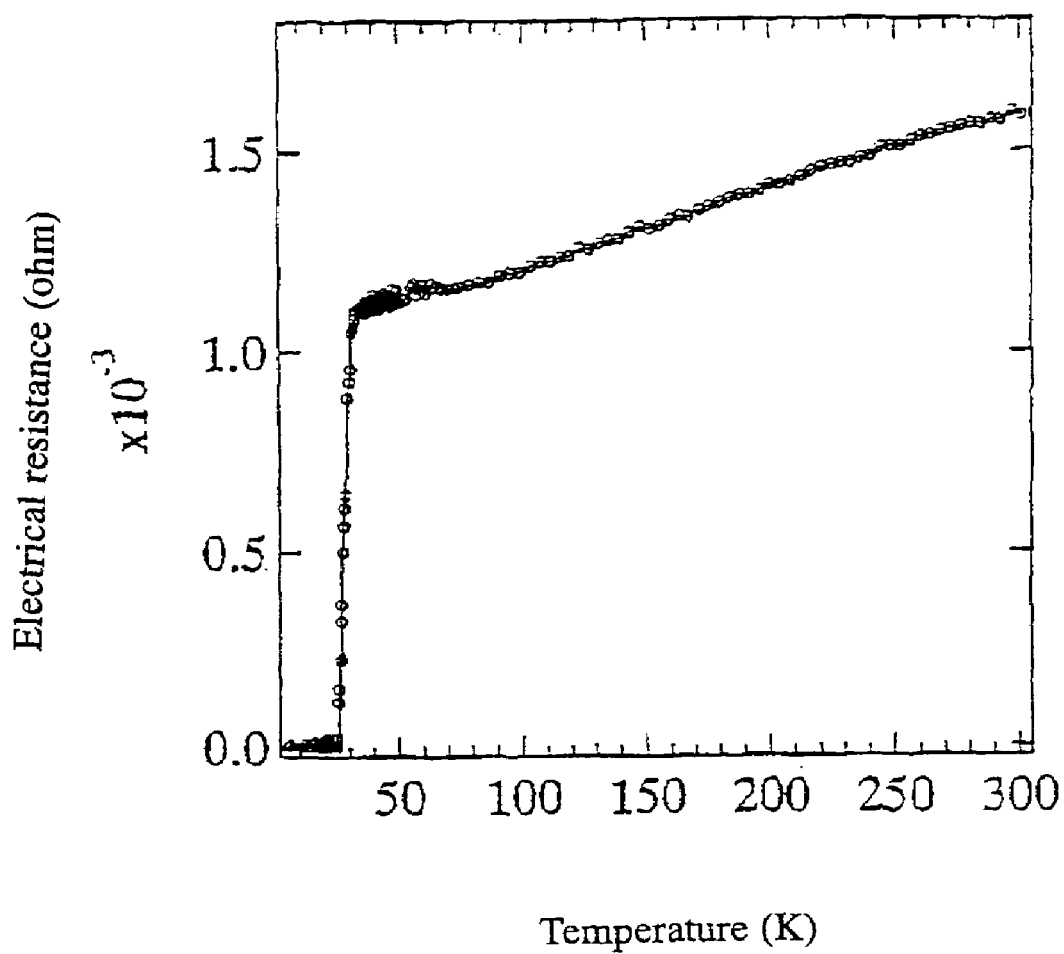
FIG. 1 is a graph showing temperature dependence of electrical resistance of a $MgB_2$ plating film as obtained in an example.

As is obvious from FIG. 1, transition to a state of zero resistance, which is based on superconductive transition, occurred at 35K. Electroplating of a $MgB_2$ film which can pass a superconductive current on the front and rear surfaces of the stainless steel tape is confirmed.

Then, conductivity was compared between a $MgB_2$ plating film formed by adding copper chloride and a $MgB_2$ plating film formed without adding it.

Figure 2:
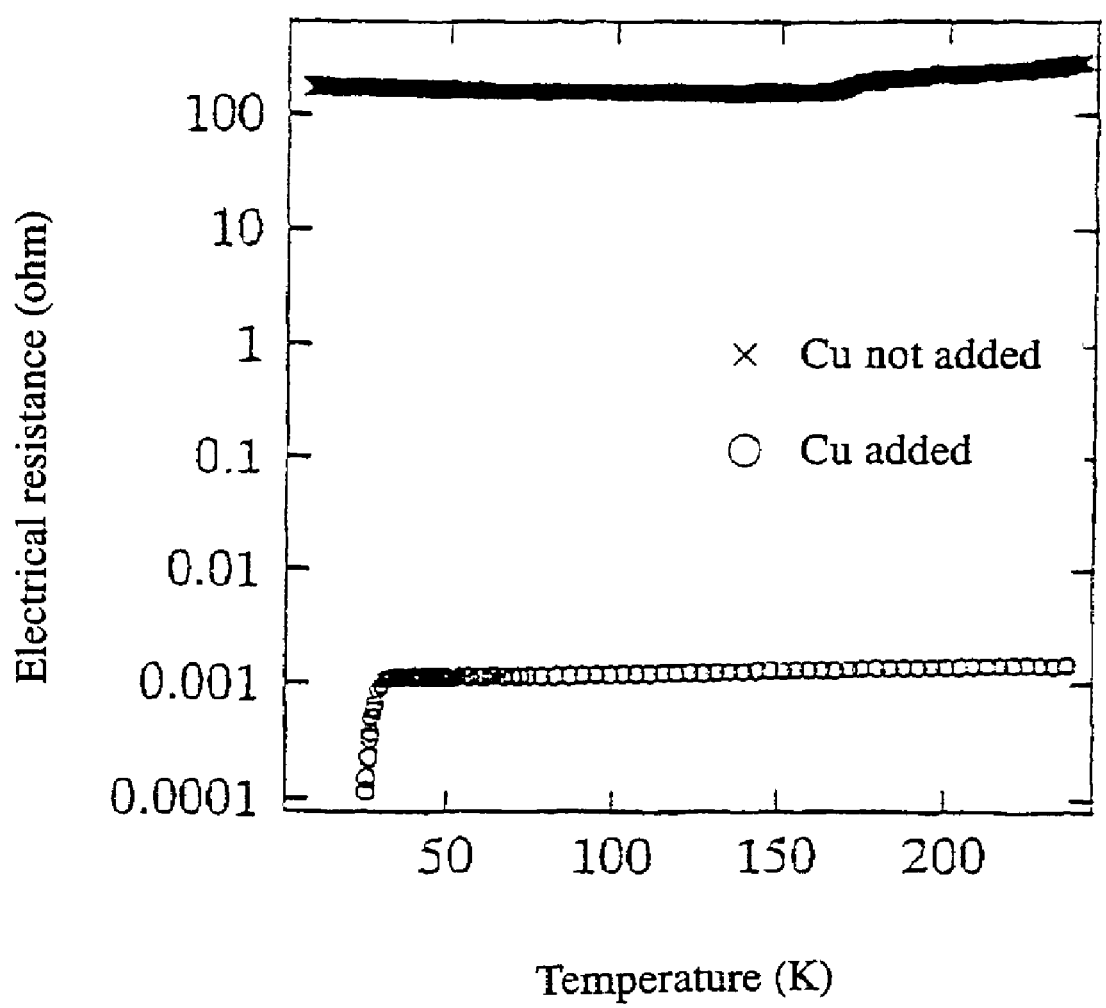
FIG. 2 is a graph comparing temperature dependence of electrical resistance of $MgB_2$ plating films with and without addition of copper chloride.

As is obvious from FIG. 2, the $MgB_2$ plating film formed without adding copper chloride did not show superconductive transition. An electrical resistance at 240K was higher by more than five figures than that of the $MgB_2$ plating film formed by adding copper chloride.

It is confirmed that the addition of copper chloride gives a $MgB_2$ plating film drastically improved conductivity.

This invention is, of course, not limited by the examples described above. It is needless to say that variations can be made in the details including the mixing ratio of magnesium chloride, potassium chloride, sodium chloride and magnesium borate, the amount of copper chloride or zinc chloride, and kind and shape of the metallic material employed as a cathode.

What is claimed is:

1. A method of manufacturing a $MgB_2$ superconducting material which comprises the steps of adding copper chloride or zinc oxide to a mixture of magnesium chloride, potassium chloride, sodium chloride and magnesium borate in the amount of copper chloride or zinc oxide much smaller than the amount of the mixture, melting a mixed salt under heat, inserting electrodes into a molten salt and electroplating a metallic material as a cathode with a magnesium diboride ($MgB_2$) film.

2. The method according to claim 1, wherein the metallic material is made of stainless steel.

* * * * *